United States Patent
Hosotani et al.

[11] Patent Number: 6,051,859
[45] Date of Patent: Apr. 18, 2000

[54] DRAM HAVING A CUP-SHAPED STORAGE NODE ELECTRODE RECESSED WITHIN AN INSULATING LAYER

[75] Inventors: Keiji Hosotani, Yokohama; Yusuke Kohyama, Yokosuka, both of Japan

[73] Assignee: Kabushiki Kaisha Toshiba, Kawasaki, Japan

[21] Appl. No.: 09/008,491

[22] Filed: Jan. 16, 1998

[30] Foreign Application Priority Data

Jan. 20, 1997 [JP] Japan .................................. 9-007666

[51] Int. Cl.⁷ ................................................. H01L 27/108
[52] U.S. Cl. .......................... 257/306; 257/295; 257/309
[58] Field of Search .................................. 257/309, 295, 257/296, 306, 310, 311, 257; 438/239, 240, 241, 242, 253–256, 396–399

[56] References Cited

U.S. PATENT DOCUMENTS

| | | | |
|---|---|---|---|
| 4,094,057 | 6/1978 | Bhattacharyya et al. | 29/571 |
| 5,101,251 | 3/1992 | Wakamiya et al. | 357/23.6 |
| 5,150,276 | 9/1992 | Gonzalez et al. | 361/313 |
| 5,323,038 | 6/1994 | Gonzalez et al. | 257/308 |
| 5,381,365 | 1/1995 | Ajika et al. | 365/149 |
| 5,436,477 | 7/1995 | Hashizume et al. | 257/310 |
| 5,444,013 | 8/1995 | Akram et al. | 437/60 |
| 5,466,964 | 11/1995 | Sakao et al. | 257/532 |
| 5,555,520 | 9/1996 | Sudo et al. | 365/149 |
| 5,563,085 | 10/1996 | Kohyama | 437/52 |
| 5,644,151 | 7/1997 | Izumi et al. | 257/306 |
| 5,668,041 | 9/1997 | Okudaira et al. | 438/240 |
| 5,691,219 | 11/1997 | Kawakubo et al. | 437/52 |
| 5,698,878 | 12/1997 | Miyashita et al. | 257/301 |
| 5,728,596 | 3/1998 | Prall | 437/52 |
| 5,801,079 | 9/1998 | Takaishi | 438/396 |

FOREIGN PATENT DOCUMENTS 8-274275  10/1996  Japan .......................... H01L 27/108

OTHER PUBLICATIONS

Nishioka et al., "Giga–bit Scale DRAM Cell with New Simple Ru/(Ba,Sr) TiO3/RU Stacked Capacitors Using x–ray Lithography", IEDM 95, pp. 903–906.

*Primary Examiner*—Jerome Jackson, Jr.
*Assistant Examiner*—Bradley William Baumeister
*Attorney, Agent, or Firm*—Banner & Witcoff, Ltd.

[57] ABSTRACT

Provided is a semiconductor device and a method of manufacturing the semiconductor device having a stacked type capacitor excellent in storage capacity, breakdown voltage and reliability. A storage node electrode (Ru) of the stacked-type capacitor is formed on a contact hole of the underlying insulating film by the steps of forming the side wall of the contact hole diagonally at a taper angle within the range of 90 to 110°, forming a storage node electrode on the inner wall surface of the contact hole, filling SOG in the contact hole, etching off the Ru film on the insulating film using SOG as a mask, and etching off the Ru film formed on the upper peripheral region of the inner wall in the depth direction of the contact hole. Thereafter, the dielectric film of the stacked-type capacitor formed of a (Ba, Sr) TiO₃ thin film is formed on the Ru storage node electrode. In this manner, it is possible to obtain a stack-type capacitor having a drastically-improved step coverage and a high breakdown voltage. In addition, it is easy to reduce the distance between adjacent Ru storage node electrodes within a resolution limit of lithography, compared to the conventional method.

27 Claims, 7 Drawing Sheets

6,051,859

DRAM HAVING A CUP-SHAPED STORAGE NODE ELECTRODE RECESSED WITHIN AN INSULATING LAYER

BACKGROUND OF THE INVENTION

The present invention relates to a semiconductor device and a method of manufacturing it, and more specifically, to a structure of a semiconductor device having a stacked type capacitor and a manufacturing method thereof.

In the semiconductor device such as a dynamic random access memory (DRAM), as an integration level is increased, a chip area inevitably increases. To prevent the increase of a chip area, it is necessary to reduce the size of an individual memory cell. On the other hand, to obtain stable operation of the DRAM, it is necessary for a memory cell capacitor to maintain a capacitance of 20 fF to 30 fF. This value has not been changed even if the generation of DRAM takes turns. To satisfy contradicted requirements mentioned above, conventionally employed are capacitors have three dimensional structure such as a trench type or a stacked type.

A large scale DRAM having an integration level as high as a gigabit order is not sufficiently attained only by use of the three dimensional capacitor. Therefore, use of a dielectric film having a high dielectric constant, such as a barium strontium titanate ((Ba, Sr) TiO$_3$) film is required as the capacitor dielectric film, FIG. 1 shows a sectional structure of a conventional stacked type DRAM memory cell employing the (Ba, Sr) TiO$_3$ film as the dielectric film for a capacitor.

The DRAM memory cell comprises a silicon substrate 1, trench isolation 2, a gate electrode 3 of an MOS transistor for charging and discharging capacitor, a word line 4, a source region 5 and a drain region 6 of an MOS transistor, a contact region 6a for connecting a bit line and a silicon substrate, an insulating film 7 surrounding the gate and the word line, a polysilicon plug 10 for connecting the source region 5 of the MOS transistor to a storage node electrode 19, a polysilicon plug 11 for connecting the substrate to the bit line, and an insulating film 17 for isolating the MOS transistor from the capacitor.

A conventionally-employed process of manufacturing the stacked type capacitor (shown in FIG. 1) employing the (Ba, Sr) TiO$_3$ as the dielectric film is as follows:

A contact hole is formed through the insulating film 17. Subsequently, a Ru film is deposited on the polysilicon plug 10 by a sputtering method and then subjected to patterning by conventionally-employed reactive ion etching (RIE) using SiO$_2$ as an etching mask. As a result, the storage node electrode 19 is obtained.

On the patterned storage node electrode 19, a (Ba, Sr) TiO$_3$ thin film 21 is deposited by metal organic chemical vapor deposition (MOCVD). Subsequently, a plate electrode 22 is formed of a Ru film on the (Ba, Sr) TiO$_2$ thin film 21 by sputtering. In this manner, a stacked-type capacitor is accomplished.

In the conventionally-employed manufacturing process for the stacked-type capacitor mentioned above, the SiO$_2$ film is first patterned on the Ru film by use of lithography in the form of an island. Then, the Ru film is etched by RIE using the SiO$_2$ film as a mask, to form the storage node electrode 19.

The size of a gap (proximity gap) between adjacent island-form SiO$_2$ mask pieces formed herein is defined by a resolution limit of lithography, so that the proximity gap between the Ru film pieces isolated by etching cannot fall within the size of the proximity gap of the SiO$_2$ mask.

Conventionally, it is not always easy to etch the Ru film. To isolate the Ru film completely, the Ru film must be over-etched up to the peripheral region under the SiO$_2$ mask. For this reason, the gap between adjacent storage node electrodes formed of the Ru film becomes inevitably larger than the proximity gap of the SiO$_2$ mask defined by a lithographic resolution limit.

When the Ru film is etched by the RIE method, the side wall of the Ru film is formed nearly vertically. To improve step coverage of the (Ba, Sr) TiO$_3$ thin film 21, the (Ba, Sr) TiO$_3$ thin film must be formed by a CVD (chemical vapor deposition) method or an MOCVD method even if the deposition method has a problem in forming a film uniformly.

As described in the forgoing, there are many problems in the semiconductor device comprising the conventional stack-type capacitor and in the manufacturing method thereof. First, the number of manufacturing steps increases since the Ru film is etched by RIE using the SiO$_2$ mask in two steps. Second, the storage capacity of the capacitor cannot be increased, since the proximity gap between the storage node electrodes made of the Ru film cannot be formed within the predetermined value defined by the lithographic resolution limit. Third, step coverage of the (Ba, Sr) TiO$_3$ thin film is poor, since the side wall of the Ru film is formed nearly vertically.

BRIEF SUMMARY OF THE INVENTION

The present invention was made to overcome the aforementioned problems. In the present invention, a depression is formed in the insulating film 17, a Ru film is formed in the inner wall of the depression instead of forming a storage node electrode 19 (Ru) formed on an insulating film 17 as in the conventional method. Therefore, a polysilicon plug 10 for connecting the storage node electrode 19 (Ru) to a source region 5 of a MOS transistor is formed on the bottom of the depression.

The inner wall of the depression crosses the upper surface of the insulating film at an interior angle within 90 to 110°. Since the aforementioned structure is made by flattening technology in combination with selective etching, the manufacturing steps can be reduced. As a result, the present invention is characterized by providing a semiconductor device and a method of manufacturing the semiconductor device having a highly reliable stacked type capacitor constructed with high degree of density.

To explain more specifically, in a first aspect, the semiconductor device of the present invention comprises:

a depression formed on a semiconductor substrate;

a conductive film formed in contact with a bottom face and an inner wall of the depression, the conductive film from an upper peripheral region of the depression being removed; and an insulating film formed so as to cover an upper surface of the semiconductor substrate, the inner wall of the semiconductor substrate exposed in the upper peripheral region of the depression, and the conductive film.

In a second aspect, the semiconductor device of the present invention comprises:

a depression formed on the semiconductor substrate a first electrode consisting of a conductive film formed in contact with a bottom face and an inner wall of the depression, the conductive film (constituting part of the first electrode) formed in the upper peripheral region of the inner wall of the depression being removed;

a dielectric film for a capacitor formed so as to cover an upper surface of the semiconductor substrate, the inner wall of the semiconductor substrate exposed in the upper peripheral region of the depression, and the first electrode; and a second electrode formed of a conductive film formed in contact with the dielectric film for the capacitor.

In a third aspect, the semiconductor of the present invention comprises:

an insulating film formed on the semiconductor substrate;

a depression formed on the insulating film, a first electrode consisting of a conductive film formed in contact with a bottom face and an inner wall of the depression; the conductive film (constituting the first electrode) formed in the upper peripheral region of the depression being removed;

a dielectric film for a capacitor formed so as to cover an upper surface of the insulating film, the insulating film exposed in the upper peripheral region of the inner wall of the depression, and the first electrode; and a second electrode consisting of a conductive film formed on and in contact with the dielectric film for the capacitor.

In a fourth aspect, the semiconductor device of the present invention comprises:

an insulating film formed on a semiconductor substrate;

a depression formed on the insulating film, a conductive plug reaching the semiconductor substrate is being exposed in part of the bottom face of the depression within the same plane as the bottom face;

a first electrode consisting of a conductive film formed in contact with a bottom face and an inner wall of the depression, the conductive film of first electrode formed in an upper peripheral region of the inner wall of the depression being removed;

at least one-layer dielectric film for a capacitor formed so as to cover an upper surface of the insulating film, the insulating film exposed in the upper peripheral region of the inner wall of the depression, and the first electrode; and a second electrode consisting of a conductive film formed on and in contact with the dielectric film for the capacitor.

In a fifth aspect, the semiconductor device of the present invention comprises:

a MOS transistor having a source and drain formed on a semiconductor substrate;

an insulating film formed on the MOS transistor;

a depression formed on the insulating film, a conductive plug reaching either the source or the drain of the MOS transistor being exposed in part of the bottom face of the depression within the same plane as the bottom face;

a first electrode consisting of the conductive film formed in contact with a bottom face and an inner wall of the depression, the conductive film of the first electrode formed on the upper peripheral region of the depression being removed;

at least one-layer dielectric film for a capacitor formed so as to cover an upper surface of the insulating film, the insulating film exposed in the upper peripheral region of the inner wall of the depression, and the first electrode; and a second electrode consisting of a conductive film formed on and in contact with the dielectric film for the capacitor.

In the semiconductor device of the present invention, it is preferable that either the semiconductor substrate with a depression or the upper surface of the insulating film formed on the semiconductor substrate cross the inner wall of the depression at an interior angle within the range of 90 to 110°.

In a sixth aspect, the semiconductor device of the present invention comprises:

a MOS transistor having a source and drain formed on a semiconductor substrate;

a first insulating film formed on the MOS transistor;

a first contact hole formed in the first insulating film and reaching either the source or the drain;

a conductive material filling in the first contact hole;

a second insulating film formed on the first insulating film and the conductive material;

a second contact hole formed in the second insulating film and reaching the conductive material;

a storage node electrode covering a bottom face and an inner wall of the second contact hole except an upper peripheral region of the inner wall of the second contact hole;

a dielectric film for a capacitor covering an upper surface of the second insulating film, the second insulating film exposed in the upper peripheral region of the inner wall of the second contact hole, and a surface of the storage node electrode; and a plate electrode formed on and in contact with the dielectric film for the capacitor.

The dielectric film for a capacitor covering the upper surface of the second insulating film, the second insulating film exposed in the upper peripheral region of the inner wall of the second contact hole, and a surface of the storage node electrode has stepped portions in an interior and a peripheral region of the second contact hole. It is more preferable that all interior angles of the stepped portions fall within the range of 90 to 110°.

The method of manufacturing the semiconductor device of the present invention comprises the steps of:

forming a MOS transistor having a source and drain on a semiconductor substrate;

forming a first insulating film on the MOS transistor;

forming a first contact hole reaching either the source or the drain in the first insulating film;

filling a conductive material in the first contact hole;

forming a second insulating film on the first insulating film and the conductive material;

forming a second contact hole in the second insulating film so as to reach the conductive material;

forming a conductive film for a storage node electrode on an upper surface of the second insulating film and a bottom face and an inner wall of the second contact hole;

filling a third insulating film in a depression formed in a portion covering the bottom face and the inner wall of the second contact hole;

etching off the conductive film for the storage node electrode formed on the upper surface of the second insulating film using the third insulating film as a mask, simultaneously etching off the conductive film for the storage node electrode formed in an upper peripheral region of the inner wall of the second contact hole;

etching off the third insulating film;

forming a dielectric film for a capacitor over an entire capacitor formation region including the depression; and forming a plate electrode on the dielectric film for the capacitor.

The step of filling the third insulating film in the depression preferably comprises forming the third insulating film on the conductive film for the storage node electrode and subsequently removing the third insulating film formed on the portion except the depression of the conductive film forming the storage node electrode by a chemical mechanical polish (CMP).

Furthermore, in the method of manufacturing the semiconductor device, it is preferable that SOG (spin on glass) be used as the third insulating film.

Still, in the method of manufacturing the semiconductor device, isotropic etching is employed in the step of etching off the conductive film for the storage node electrode formed on the second insulating film using the third insulating film as a mask, and in the simultaneously-performed step of etching off the conductive film for the storage node electrode formed in the upper peripheral region of the inner wall of the second contact hole.

The method of manufacturing the semiconductor device is characterized in that, in the step of forming the second contact hole in the second insulating film so as to reach the first conductive material, the surface of the second insulating film crosses the inner wall of the second contact hole at an interior angle within the range of 90 to 110°.

The method of manufacturing the semiconductor device is characterized in that, in the step of etching off the conductive film for the storage node electrode formed in the upper peripheral region of the inner wall of the second contact hole, the surface of the conductive film for the storage node electrode formed on the inner wall is etched in parallel to the upper surface of the second insulating film.

In another aspect, the method of manufacturing a semiconductor device comprising the steps of:

forming a MOS transistor having a source and drain on a semiconductor substrate;

forming a first insulating film on the MOS transistor;

forming a first contact hole reaching either the source or the drain in the first insulating film;

filling a conductive material in the first contact hole;

forming a second insulating film on the first insulating film and the conductive material;

forming a second contact hole in the second insulating film so as to reach the conductive material;

forming a conductive film for the storage node electrode on an upper surface of the second insulating film, and a bottom face and an inner wall of the second contact hole;

forming a third insulating film on the conductive film for the storage node electrode formed in the depression;

removing the third insulating film and the conductive film for the storage node electrode formed on the second insulating film except the depression by a CMP method;

etching off the conductive film for the storage node electrode formed in the upper peripheral region of the inner wall of the second contact hole using a third insulating film as a mask;

etching off the third insulating film;

forming a dielectric film for a capacitor over an entire capacitor formation region including the depression; and forming a plate electrode on the dielectric film for the capacitor.

The storage node electrode mentioned above is formed of at least one element selected from the group consisting of Ru, Pt, Re, Os, Rh, Ir, oxides thereof, alloys and alloy oxides of the aforementioned elements, W, Nb, Al, Ti, Ta, Mo, Cu, WN, NbN, TiN, TaN, Pd. The dielectric film for the capacitor is formed of at least one element selected from the group consisting of (Ba, Sr) $TiO_3$, $BaTiO_3$, $SrTiO_3$, $PbZrO_3$, $LiNbO_3$, $Bi_4Ti_3O_{12}$, $Ta_2O_5$, and a multi-layered film formed of the aforementioned elements.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinbelow, embodiments of the present invention will be described in detail with reference to the accompanying drawings.

Figure 2A:
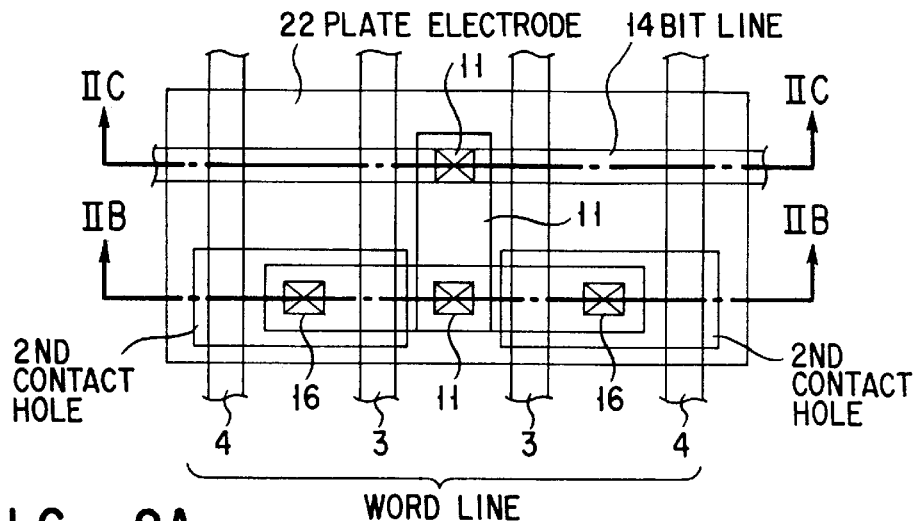
FIG. 2A is a plan view of a memory cell of the semiconductor device having a stack type capacitor of the present invention.

FIG. 2A is a partially magnified plan view of a semiconductor memory device consisting of DRAM memory cells having a stacked type capacitor, according to Embodiment 1 of the present invention. As shown in FIG. 2A, a plate electrode 22 of the stacked type capacitor is positioned so as to cover an MOS transistor formed under the electrode and the bit line 14.

Reference numerals 3 and 4 denote word lines. A contact hole 16 connects the stacked type capacitor to the source region of the MOS transistor underneath. A second contact hole is formed above and around the contact hole 16.

Reference numeral 11 indicates an extended line and a contact hole for connecting a bit line to the drain region of the MOS transistor formed in a lower portion. The plan view includes two MOS transistors constituting two one-MOS transistor type memory cells.

Figure 2B:
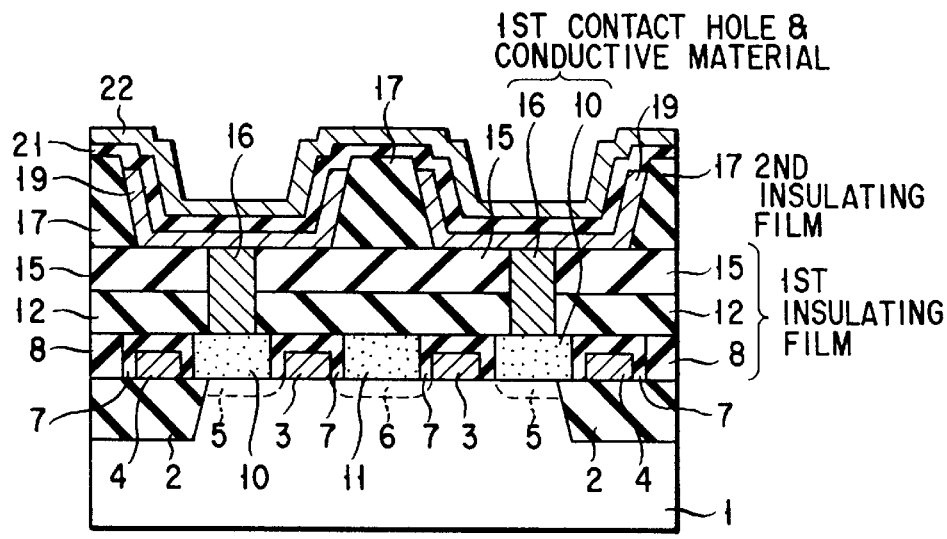
FIG. 2B is a sectional view taken along the line IIB—IIB of the memory cell shown in FIG. 2A.

FIG. 2B is a cross sectional view taken along the line IIB—IIB of FIG. 2A. Reference numerals 1, 2 and 3 indicate a silicon substrate, an insulating film for isolating devices, and a gate electrode of the MOS transistor, respectively. As shown in the plan view of FIG. 2A, the gate electrode 3 is extended in the row direction of the memory cell array and used as a word line connecting gates of adjacent MOS transistors in the row direction. A word line 4 shown in FIG. 2B is arranged on both sides of the gate electrode 3 and connecting the gate electrodes of other memory cells formed simultaneously with the gate electrode 3. The word line 4 is an extended structure having the same sectional shape as the gate electrode 3.

Reference numerals 5 and 6 of FIG. 2B denote a source and drain region. The gate electrode 3 and word line 4 are coated with an insulating film 7. The insulating films 8, 12, and 15 isolate a MOS transistor formed on the silicon substrate 1 from the stacked type capacitor formed above the MOS transistor. The insulating films 8, 12 and 15 shown in FIG. 2B will be collectively referred to as "first insulating film" in this specification.

Both plug 10 and plug 16 (formed on the plug 10) serve as a conductive plug for connecting the source region 5 of the MOS transistor to the stacked type capacitor.

As shown in FIG. 2B of the present invention, the plugs 10 and 16 will be referred to as "first contact hole and conductive material". The plug 11 is a conductive plug for connecting the drain region 6 of the MOS transistor to a bit line.

The second insulating film 17 supports the stacked-type capacitor. The second contact hole is formed in the second insulating film 17 so as to reach the first conductive material 16. Then, a storage node electrode 19 formed of a conductive film, a dielectric film 21 formed of a (Ba, Sr) TiO$_3$ for a capacitor, and a plate electrode 22 are provided in the second contact hole. As a result, the stacked-type capacitor is formed on the MOS transistor.

Figure 2C:
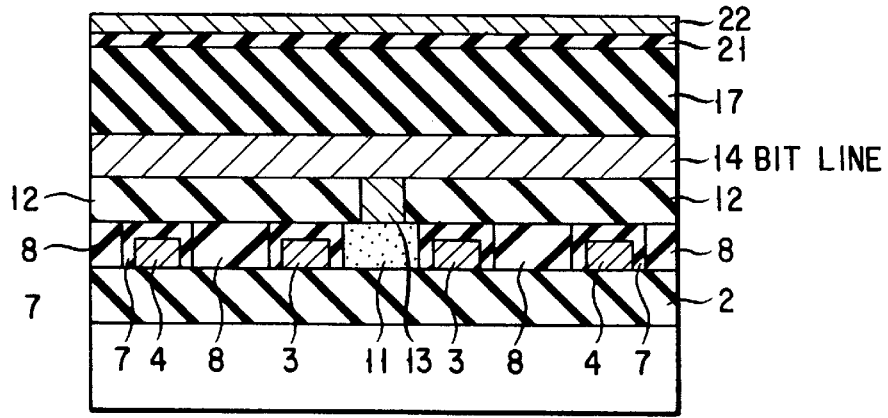
FIG. 2C is a sectional view taken along the line IIC—IIC of the memory cell shown in FIG. 2A.

FIG. 2C is a cross sectional view taken along the line IIC—IIC of FIG. 2A. The plug 11 connecting to the drain region 6 shown in FIG. 2B is extended to a position of the bit line 14 as shown in FIG. 2A and connected to the bit line 14 via a plug 13.

Now, the method of manmeacturing a semiconductor memory device according to Embodiment 1 of the present invention will be explained with reference to FIGS. 3A to 3J. A well region (not shown) is formed in a device formation region on the silicon substrate 1 by implanting p-type impurity ions into the silicon substrate 1. Then, a device isolation region 2 (shown in FIG. 3A) is formed by a generally-used STI (Shallow Trench Isolation) method.

To form the MOS transistor, a gate oxide film of 6 nm (not shown) is first formed on the silicon substrate. Subsequently, a polysilicon (about 50 nm) and tungsten silicide (WSi) or tungsten (W) of about 100 nm, and silicon nitride (SiN, about 100 nm) are deposited successively on the gate oxide film. The patterning is made using the silicon nitride as a mask to form a gate electrode 3. The stacked structure of the gate electrode 3 is omitted in FIG. 2B to FIG. 6 for simplicity's sake. The sectional view of the gate electrode 3 shown in these figures appears to have a simple uniform structure. The word line 4 is formed in the same structure as the gate electrode 3.

After the formation of the gate electrode 3, n-type impurity ions such as P or As are implanted using the gate electrode as a mask to form a source and drain region (5, 6). Subsequently, silicon nitride (for example, 30 nm) is deposited. The silicon nitride is etched back by anisotropic etching. As a result, side walls of silicon nitride is formed on both side surfaces of each of the gate electrode 3 and the wiring 4. The upper surface and both side faces of each of the gate electrode 3 and the wiring 4 are covered with the silicon nitride films one of which is used as the etching mask and the other of which is used as the side walls, as indicated by reference numeral 7 in FIG. 3A.

After the MOS transistor charging and discharging a memory cell capacitor is formed through the aforementioned steps, the insulating film 8 (about 250–300 nm) is formed by BPSG (borophosphosilicate glass) or plasma SiO$_2$.

Figure 3A:
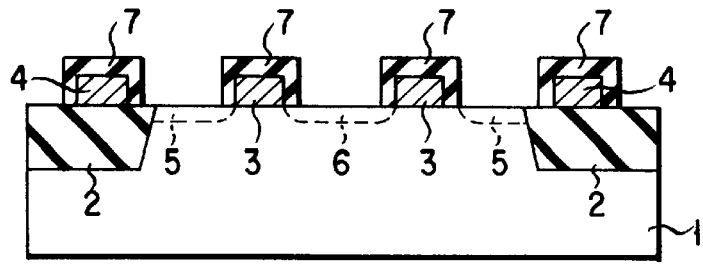
FIGS. 3A to 3J are sectional views of the semiconductor device according to Embodiment 1 of the present invention, for showing manufacturing processes thereof step by step.
Figure 3B:
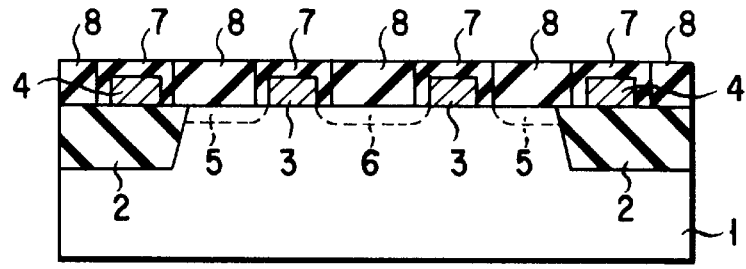

Subsequently, as shown in FIG. 3B, the surface of the resultant structure is flattened by CMP using an nitride film 7 (formed over the gate electrode 3 and the wiring 4) as a stopper. As a result, the space formed between the gate electrode 3 and the wiring 4 is filled with the insulating film 8 formed of BPSG or plasma SiO$_2$.

Figure 3C:
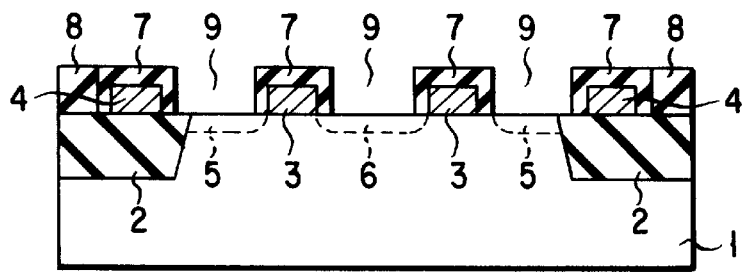
Figure 3D:
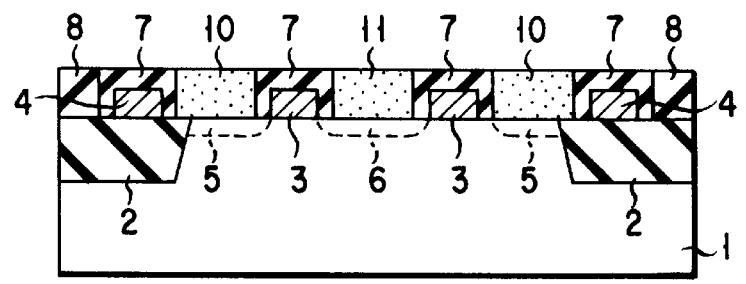

The flattened surface is then covered with a resist, in such a manner that the insulating film 8 formed on the source and drain region is exposed. The exposed insulating film 8 is removed by etching, thereby forming a contact hole 9 in a self alignment manner at a position corresponding to the gate electrode, as shown in FIG. 3C.

Then, the resist is removed. To form a plug in the contact hole 9, the conductive film such as polysilicon doped with P or As is deposited over the entire surface of the resultant structure. The conductive film is flattened by the CMP method using the nitride film 7 (formed on the gate electrode and the wiring) as a stopper. In this way, the spaces formed on the source region 5 and the drain region 6 are filled with the conductive polysilicon 10 and 11, respectively.

The polysilicon filled in the space formed on the source region 5 acts as the plug 10 which is connected to the storage node electrode 19 of the capacitor shown in FIG. 2B. The polysilicon filled in the space formed on the drain region 6 serves as the extraction plug 11 which is used for forming a bit line in a different place from the device region, as shown in FIG. 2A.

Subsequently, as shown in a cross-sectional view (FIG. 3E) taken along the line IIC—IIC of FIG. 2A, BPSG or plasma SiO$_2$ (10 nm to 200 nm) is deposited over the entire surface to form an insulating film 12. Then, a bit line contact hole reaching the extraction plug 11 is formed by using the resist mask for a bit-line forming contact hole. Afterward, Ti/TiN (about 25 nm thick) and W (about 200 nm thick) are deposited by a sputtering method and flattened by the CMP method using a second insulating film 12 as a stopper. Consequently, a bit line contact plug 13 is formed on the extraction plug 11.

Figure 3E:
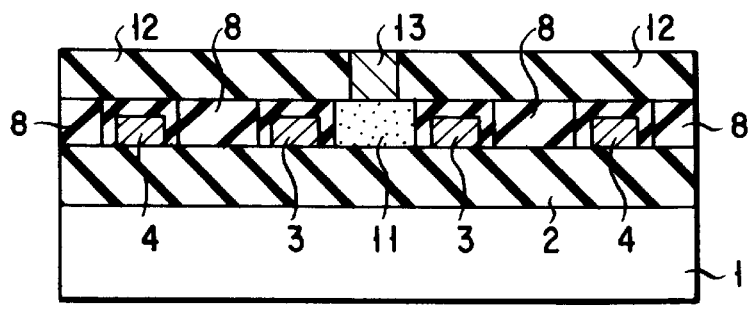

FIG. 3E is a cross sectional view taken along the IIC—IIC of FIG. 2A for showing a connection state of the extraction plug 11 and a bit line 14. The sectional view shows the structure formed from the initial step to the aforementioned step. FIG. 3A to FIG. 6 except FIG. 3E are all cross sectional views taken along the IIB—IIB of FIG. 2A.

Subsequently, Ti/TiN (about 25 nm thick) and W (about 100 nm thick) are deposited by the sputtering method. Thereafter, a nitride film (about 150 nm, not shown) is deposited by the CVD method. The Ti/TiN, W, and nitride film are patterned by the RIE method to form the bit line 14 (see FIG. 2A).

Figure 3F:
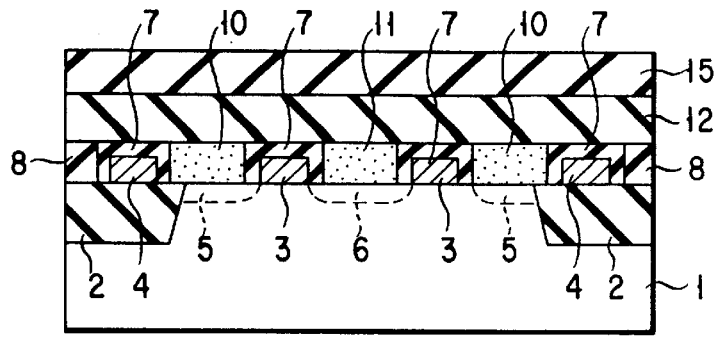

As a next step, an insulating film 15 (BPSG or plasma SiO$_2$) is deposited over the entire surface of the resultant structure and flattened by the CMP method using the nitride film (formed on the bit line, which has been used as the bit-line formation mask) as a stopper, as shown in FIG. 3F.

Figure 3G:
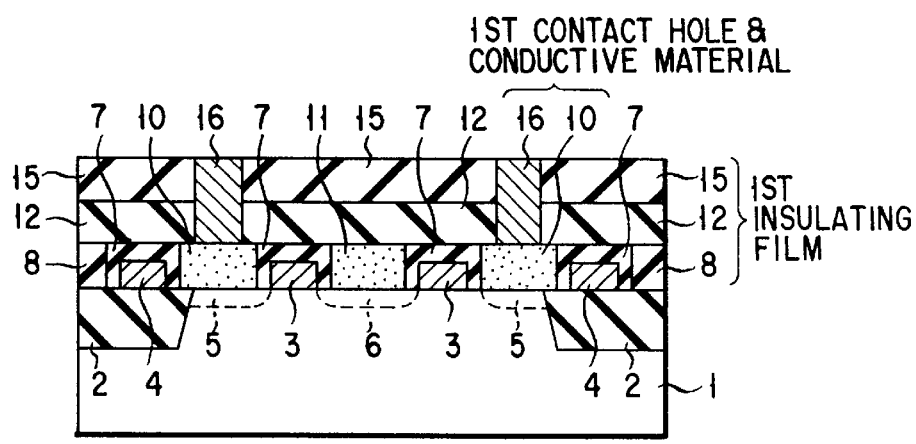

Thereafter, as shown in FIG. 3G, a contact hole is formed through the insulating film 15 and the previously deposited insulating film 12 by the RIE method in such a way that the polysilicon plug 10 formed on the source region is exposed. Subsequently, Ti (25 nm to 30 nm) is deposited by the sputtering method and annealed for 30 minutes at 550° C. W (150 nm to 200 nm) is further deposited on the Ti film and flattened by the CMP method using the insulating film 15 as a stopper. As a result, the plug 16 to be connected to the storage node electrode 19 is formed.

In this way, the source region 5 of the MOS transistor formed on the silicon substrate 1 is connected to the stacked-type storage node electrode 19 (formed in contact with the insulating film 15) via contact holes formed through the insulating films 8, 12, and 15 and via plugs 10 and 16 (formed of the conductive material filling in the contact hole). Hence, the insulating films (8, 12, 15), contact holes formed through these insulating films, and the conductive material filling in the contact holes will be referred to as "first insulating film" and, "first contact hole" and "conductive material", respectively as shown in FIG. 3(G).

Figure 3H:
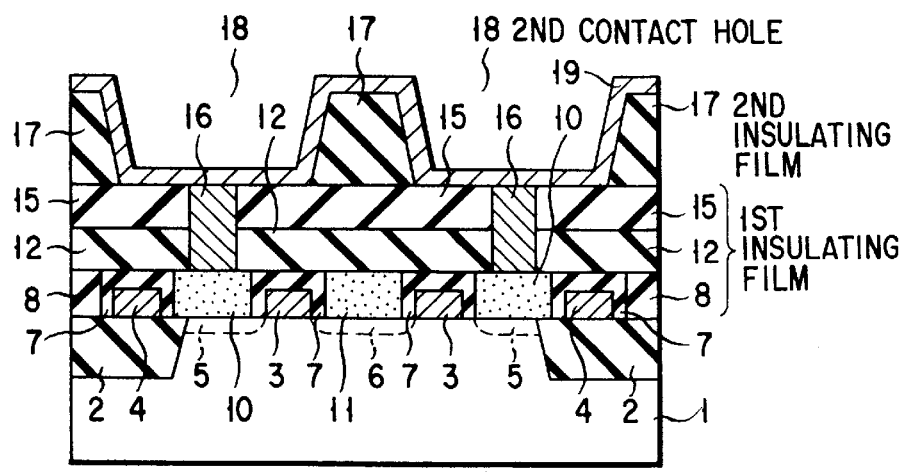

As shown in FIG. 3H, plasma SiO$_2$ (250 to 300 nm thick) is deposited over the entire surface of the first insulating film, thereby forming the second insulating film 17 (SiO$_2$) on the first insulating film. The second insulating film 17 (SiO$_2$) is subjected to a general taper-etching step to form a second contact hole 18. The wall of the second contact hole 18 is diagonally formed at a taper angle within the range of 90° to 110°. The contact hole 18 is formed in such a way that an upper end portion of the plug 16 (to which the storage node electrode 19 is connected) is exposed at the bottom.

Subsequently a Ru film 19 (50 nm to 60 nm thick) serving as the storage node electrode is deposited over the entire surface by the sputtering method and then SOG is deposited over the entire surface by the spin coating method. The SOG is flattened by the CMP method using the Ru film 19 as a stopper, thereby forming an SOG etching mask 20 (for use in etching of the storage node electrode 19) in the depression of the Ru film formed along the shape of the second contact hole 18.

Figure 3I:
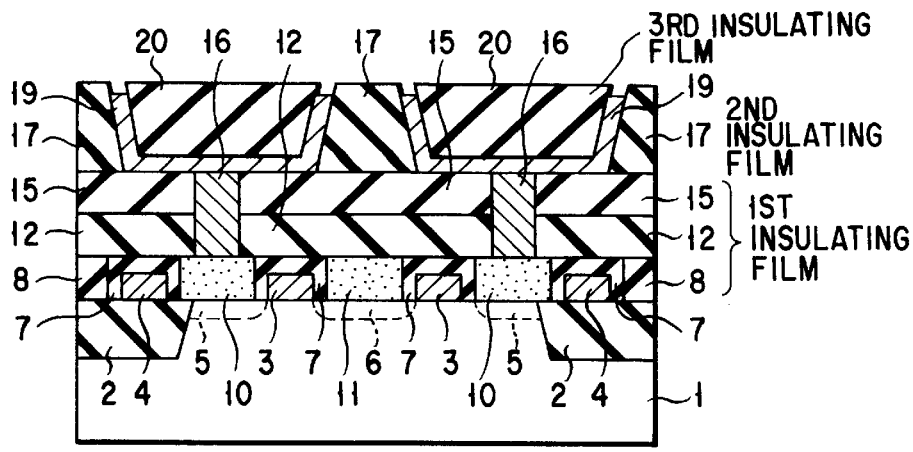

As shown in FIG. 3I, the Ru film is etched in a depth of 80 nm to 90 nm by use of the etching mask 20. During the etching, the Ru film formed on the second insulating film 17 shown in FIG. 3H is removed. Simultaneously, the Ru film between the inner wall of the second contact hole 18 and the etching mask 20 is etched in a depth of about 20 nm to 30 nm and removed from the inner wall.

After SOG serving as the etching mask 20 is deposited over the entire surface by the spin coating method, SOG and the Ru film 19 are flattened by the CMP method using the second insulating film 17 as a stopper. After the Ru film 19 on the second insulating film 17 is removed by the CMP method, the Ru film between the inner wall of the second contact hole 18 and the etching mask 20 is etched in a depth of 20 nm to 30 nm to form the same structure as shown in FIG. 3I.

The Ru film is isotropically etched. More specifically, the etching proceeds in the depth direction of the second contact hole 18 while the etched surface of the Ru film is maintained in parallel to the upper surface of the second insulating film 17. In this manner, the storage node electrode 19 (Ru) is formed inside the second contact hole 18.

Then, the SOG 20 is removed by wet etching. A selective etching ratio of SOG 20 to the second insulating film 17 (formed of a plasma SiO$_2$) used herein is 100 or more.

Figure 3J:
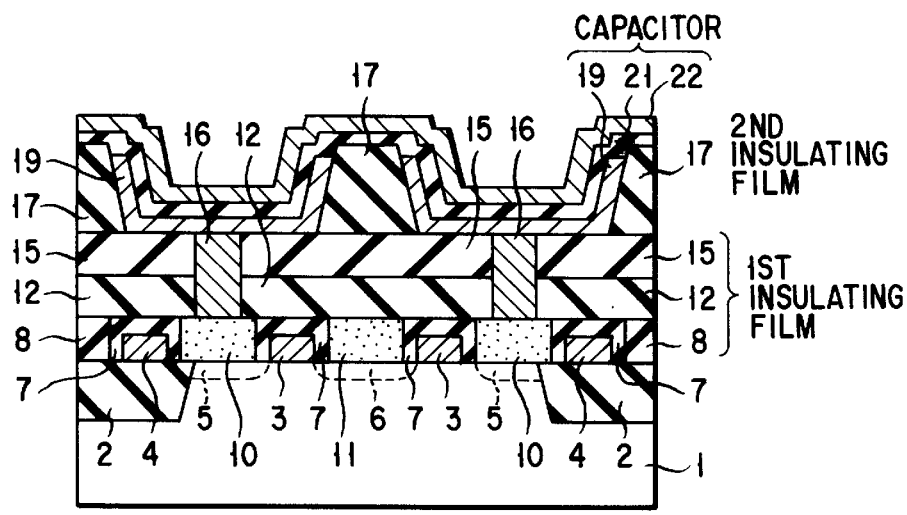

As shown in FIG. 3J, a dielectric film 21 for the capacitor is formed by depositing a (Ba, Sr) TiO$_3$ thin film (50 nm–60 nm thick) by the sputtering method and annealed for crystallization at 700° C. for one minute. Subsequently, a Ru film (50 nm–60 nm thick) is formed by the sputtering method to form a plate electrode 22. In this way, a capacitor of the semiconductor device consisting of the storage node electrode 19, the dielectric film 21, and the plate electrode 22, is accomplished.

Figure 4:
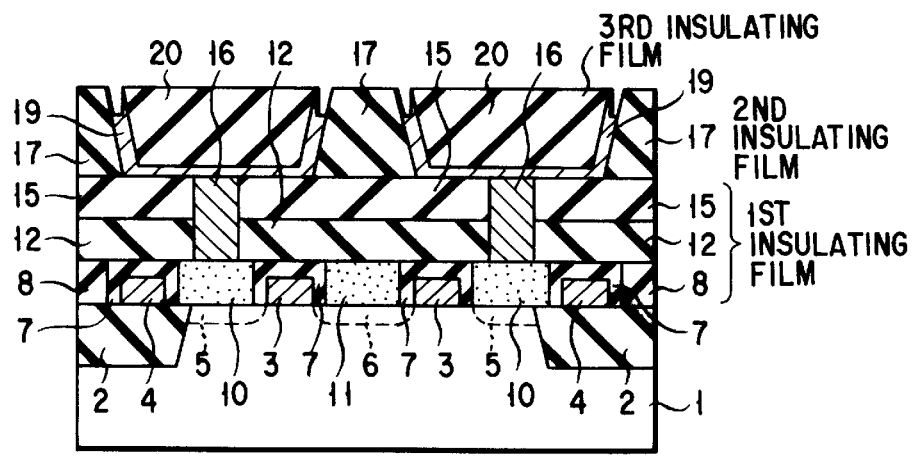
FIG. 4 is a cross-sectional view of a semiconductor device, particularly showing an acute angle portion produced in the upper peripheral portion of the Ru film by anisotropic etching.

When the Ru film between the inner wall of the second contact hole 18 and the etching mask 20 is anisotropically etched in a depth of 20 nm to 30 nm, a edge portion protruding at an acute angle appears at an upper periphery of the storage node electrode 19 after etching, as shown in FIG. 4. If the dielectric film 21 for the capacitor is formed on the storage node electrode 19 thus obtained, the reliability of the film will significantly degrade.

Since the inner wall of the second contact hole 18 formed through the second insulating film 17 is upwardly widened at a taper angle within the range of 90° to 110°, the thus-formed dielectric film ((Ba, Sr) TiO$_3$ thin film) of the capacitor follows the upwardly widened shape of the inner wall. As a result, all step edges of the resultant dielectric film for the capacitor are bent at an obtuse angle within the range of 90° to 110° in the same as in the storage node electrode and the plate electrode. By virtue of this, it is possible to obtain the capacitor having a uniform (Ba, Sr) TiO$_3$ thin film having high breakdown voltage.

As mentioned above, in the step of forming the dielectric film for the capacitor having a high breakdown voltage by forming the inner wall of the second insulating film 17 diagonally at a predetermined taper angle, the most important point is a bending angle of the capacitor dielectric film. If the bending angle is less than 90° (acute angle), remarkable electric field concentration effect appears at the step edge. The film is also anomalously grown at the portion bent at an acute angle, so that the breakdown voltage of the capacitor insulating film sharply decreases.

To obtain an excellent capacitor exhibiting a high breakdown voltage, the bending angle of the dielectric film 21 of the capacitor (shown FIG. 3J) must fall within the range of 90 to 110°.

On the other hand, when the taper angle is larger than 110°, the capacitor occupies a larger area. In addition, uniformity in isotropic etching of the storage node electrode 19 decreases. As a result, it will be difficult to etch the surface of the storage node electrode 19 and the surface of the second insulating film 17 in parallel. Accordingly, the capacitor insulating film formed on them is bent anomalously.

Figure 5:
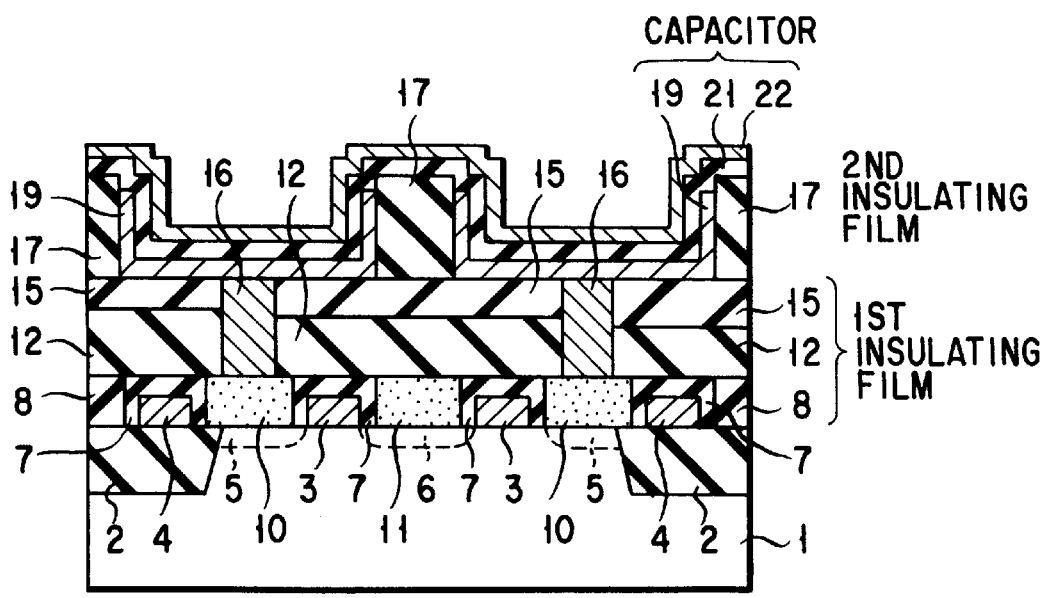
FIG. 5 is a sectional view of the semiconductor device according to Embodiment 2 of the present invention.

Now, a second embodiment of the present invention will be explained with reference to FIG. 5. FIG. 5 is a cross sectional view showing a structure of the semiconductor device in which the inner wall of the second contact hole formed through the second insulating film 17 crosses the upper surface of the insulating film 17 at an angle of exactly 90°.

The semiconductor shown in FIG. 5 is formed by using the same materials in the same processing manner as in FIGS. 3A to 3J except that a conventionally-employed CVD is used for forming the storage node electrode, the dielectric film for the capacitor, and the plate electrode, since the sputtering method cannot be employed to form the Ru film and the dielectric film for the capacitor.

When the CVD method is employed, there is a problem in that the film is not formed uniformly. In particular, anomalous growth tends to be generated at the upper corner of the step edge. The portion having a great effect on the breakdown voltage of the capacitor dielectric film is the anomalous growth portion of the underlying Ru film formed in the upper peripheral region of the second contact hole 18 shown in FIG. 3H.

In this case, if the anomalous growth of the underlying Ru film is removed by isotropic etching in the step shown in FIG. 3I, the breakdown voltage of the capacitor dielectric film formed on the Ru film can be remarkably improved.

As shown in FIG. 5, when the inner wall of the second contact hole crosses the upper surface of the second insulating film 17 at an angle of 90°, needless to say, the occupation area of the capacitor is reduced compared to Embodiment 1 in which the cross angle is within the range of 90° to 110°.

Figure 1:
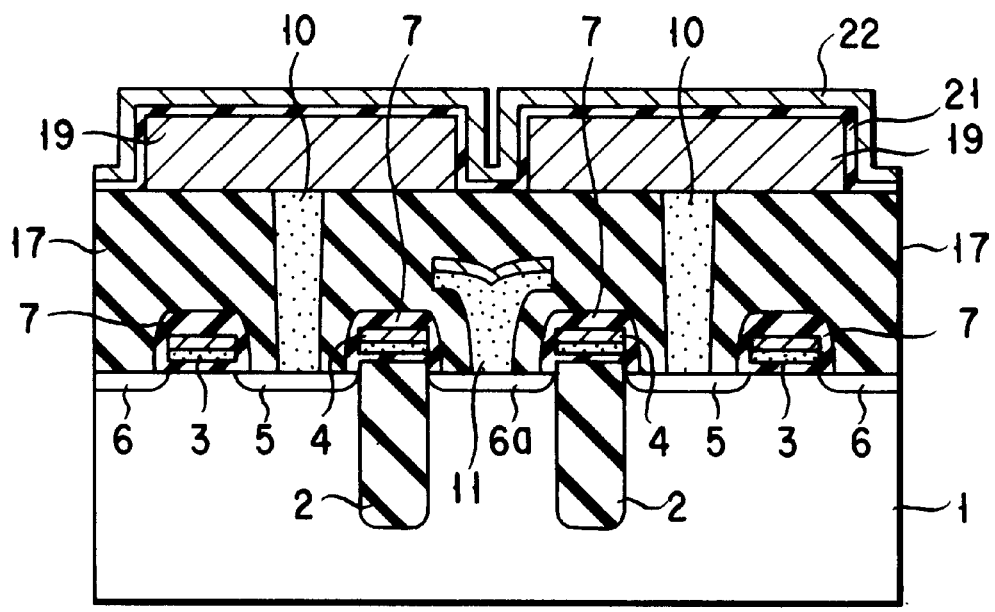
FIG. 1 is a sectional view of a memory cell of a semiconductor device having a conventionally-used stacked type capacitor.

Compared to the manufacturing process for the conventional stacked-type capacitor shown in FIG. 1, a gap between the adjacent Ru storage node electrodes is defined by the gap between adjacent second contact holes 18 shown in FIG. 3H. However, the second insulating film 17 having the second contact hole formed therein is made of $SiO_2$, so that etching accuracy is higher than the case where Ru is used. In addition, if the amount of over-etching is controlled, the size of the proximity gap between the second contact holes 18 can be reduced than the proximity gap of the etching mask which is defined by the resolution limit of lithography.

As described in the foregoing, if the structure of the semiconductor device and the manufacturing method shown in Embodiment 2 of the present invention is employed, a semiconductor device having a stacked capacitor excellent in reliability can be obtained in fewer steps than the conventional method.

If the storage node electrode 19 (Ru) formed inside the second contact hole 18 is not etched in a depth of about 20 nm to 30 nm, the following problems are raised.

The problems will be explained with reference to FIG. 6.

When SOG 20 is removed by wet etching, the second insulating film 17 using plasma $SiO_2$ is also etched in a depth of about 2 nm to 3 nm, with the result that a projection 19a (surrounded by a broken-line circle in FIG. 6) is grown in the storage node electrode 19 (Ru) after the SOG 20 is wet etched. The dielectric thin film 21 ((Ba, Sr) $TiO_3$) for the capacitor and the plate electrode 22 (Ru) will be formed on the projection 19a.

Figure 6:
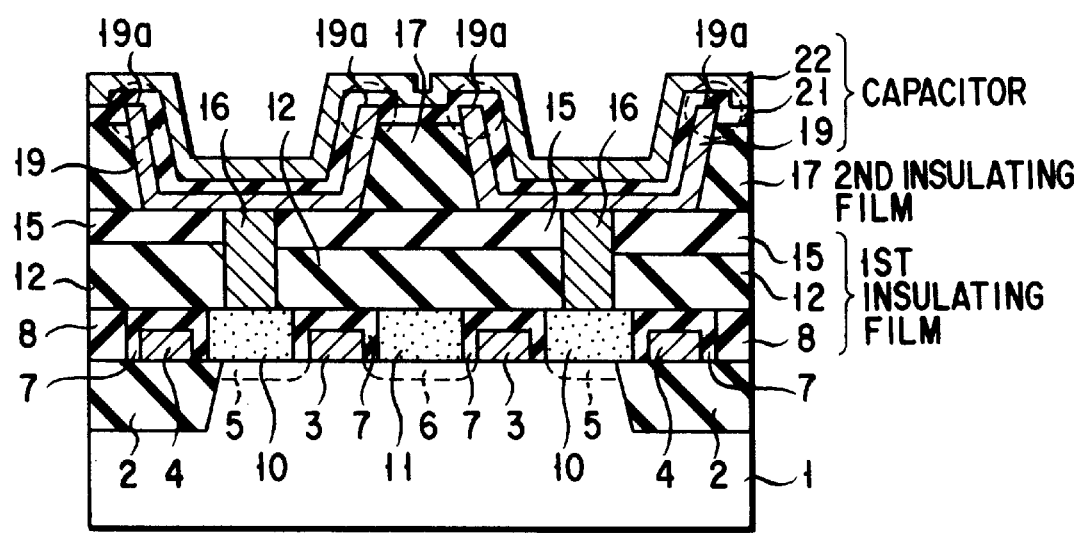
FIG. 6 is a sectional view of a semiconductor device, particularly showing a projection produced in the Ru film left in the upper periphery of a contact hole in the case where the Ru film is not removed.

However, it is extremely difficult to deposit to form a thin film, that is, the dielectric film 21 of the capacitor and a plate electrode 22 uniformly on the upper step edge including the acute-angled portion, namely, the projection 19a (shown in FIG. 6). In addition, the electric field concentration occurs at the projection 19a, causing a decrease in breakdown voltage of the capacitor.

When the taper angle of the contact hole is within the range of 90° to 110° as shown in Embodiment 1, the projection 19a crosses the side wall of the second insulating film 17 at an acute angle. As a result, anomalous deposition takes place in the dielectric film for the capacitor. As shown in Embodiment 2, when the second contact hole crosses the second insulating film 17 at right angle, two adjacent right-angled corners are formed at the projecting portion. Therefore, the dielectric film is anomalously grown by the CVD method.

The present invention is not limited to embodiments mentioned above. If the structure of the semiconductor device and the method of manufacturing thereof are partially employed in a structure of a general semiconductor device and method manufacturing thereof as shown in FIG. 7, the yield and reliability of the semiconductor device can be further improved compared to a conventional one.

Figure 7A:
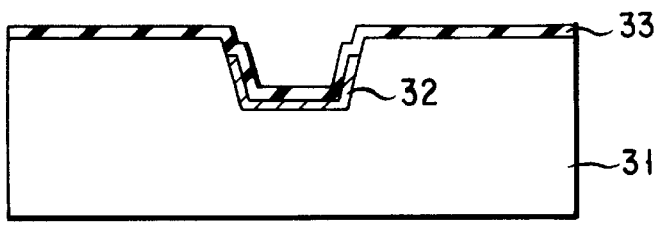
FIGS. 7A to 7E are sectional views of the semiconductor devices according to modifications of Embodiment 1 of the present invention.

To be more specific, the present invention can be applied to a semiconductor device and a method of manufacturing the semiconductor device comprising a depression having a straight wall (90°) or a depression upwardly widened with an angle within the range of 90° to 110° formed directly on the semiconductor substrate 31 by a general method, a conductive film 32 formed in contact with the bottom and side faces of the depression, a structure formed by removing the conductive film 32 formed on the upper peripheral region of the depression as explained above and then forming an insulating film 33 on the resultant structure so as to cover the upper surface of the semiconductor substrate and the semiconductor substrate exposed in the upper peripheral region of the depression as shown in FIG. 7A.

If the depression having a conductive-film removed portion (the upper peripheral region) is covered with the insulating film 33, followed by laminating a conductive film 32 and an insulating film 33 required for the formation of the semiconductor device, as mentioned above, the step coverage of the insulating film 33 covering the conductive film 32 can be completely made even if the depression is formed directly on the semiconductor substrate 31. In addition, the breakdown voltage is improved, with the result that the production yield and the reliability of the semiconductor device can be drastically improved.

Figure 7B:
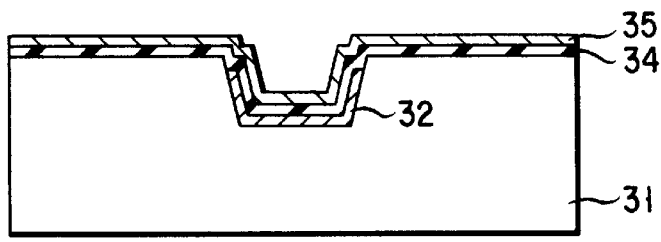

Furthermore, the present invention can be applied to a semiconductor device and a method of manufacturing the semiconductor device comprising a first electrode 32 formed of a conductive film provided in the depression of the semiconductor substrate 31; a dielectric film 34 for a capacitor consisting of at least one-layer which is formed by removing the conductive film 32 formed on the upper peripheral region of the inner wall of the depression (first electrode) and covering the semiconductor substrate 31, the semiconductor substrate exposed in the upper peripheral region of the inner wall of the depression, and conductive film 32; and a second electrode 35 on and in contact with the dielectric film 34 as shown in FIG. 7B.

The dielectric film 34 for the capacitor formed so as to cover the first electrode 32 exhibits excellent step coverage. Since the electric field concentration does not take place in the upper peripheral region of the inner wall of the depression, the dielectric film 34 has large breakdown voltage relative to the second electrode 35 formed on the dielectric film 34. As a result, the semiconductor device comprising the capacitor can be drastically improved in production yield and reliability.

Figure 7C:
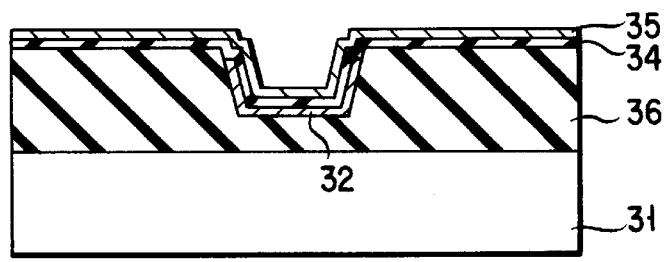

Furthermore, the present invention can be applied to a semiconductor device and a method of manufacturing the semiconductor device comprising a depression formed in the insulating film 36 on the semiconductor substrate 31; a first electrode 32 formed in contact with the bottom face and the inner wall of the depression; a dielectric film 34 for the capacitor formed by removing the conductive film (first electrode 32) formed in the upper peripheral region of the depression and forming the dielectric film 34 so as to cover the upper surface of the insulating film 36 and the insulating film 36 exposed in the upper peripheral region of the inner wall of the depression, and the first electrode 32; and a second electrode 35 formed in contact with the dielectric film 34 for the capacitor as shown in FIG. 7C.

Figure 7D:
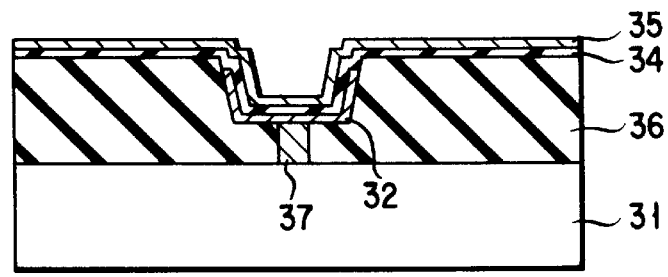
Figure 7E:
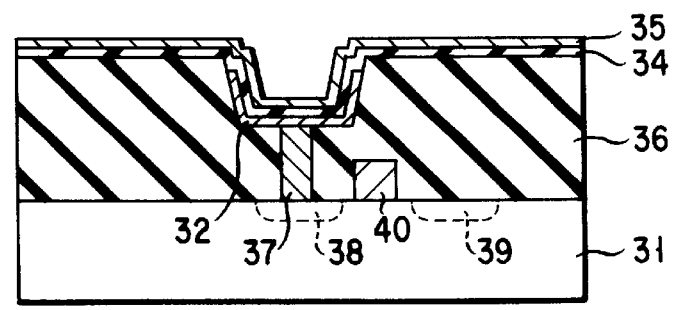

The present invention may be also applied to a semiconductor device and a method of manufacturing the semiconductor device comprising a conductive plug 37 at part of the bottom surface of the depression formed in the insulating film 36 so as to reach the semiconductor substrate 31 through which the capacitor is connected to the semiconductor substrate below as shown in FIG. 7D. Alternatively, a MOS transistor with a source region 38, a drain region 39 and a gate electrode 40 may be formed on the semiconductor substrate 31 and the conductive plug 37 may be connected to the source or the drain region 38, 39 of the MOS transistor as shown in FIG. 7E.

In Embodiments 1 and 2, we have explained the semiconductor device and the method of manufacturing the semiconductor device having the stacked-typed capacitor which is constructed by forming first and second contact holes in the first and second insulating film, forming a capacitor in the inner wall of the second contact hole, the inner wall being formed diagonally at a predetermined taper angle, connecting the storage node electrode to the source and drain region of a MOS transistor formed on the semiconductor substrate with the conductive plug filling in the first and second contact holes.

However, the stacked-type capacitor does not need to be formed by using the first and second insulating films. Since it is relatively easy to form the depression widen upwardly at a taper angle within the range of 90° to 110° in an insulating film formed of, for example, $SiO_2$, by a general RIE method, as mentioned above, a capacitor can be formed on the inner wall of the depression by first forming a contact hole reaching the semiconductor substrate through a single-layer insulating film formed on the semiconductor substrate, filling the conductive plug in the contact hole, forming the depression by second masking. If it is not necessary for the capacitor to be connected to the semiconductor substrate via the conductive plug, the manufacturing steps of the capacitor are further simplified.

If a highly reliable capacitor is formed on the insulating film on the semiconductor substrate and connected to an element such as a MOS transistor formed on the semiconductor substrate by use of the conductive plug, the application field of the capacitor can be further widen.

As the storage node electrode and the plate electrode, or the conductive film of the depression of the stacked-type capacitor, Pt, Re, Os, Rh, Ir, oxides thereof, alloys and alloy oxides of the aforementioned elements, W, Nb, Al, Ti, Ta, Mo, Cu, WN, NbN, TiN, TaN, Pd and the like, may be used other than Ru. As the dielectric film of the capacitor, $BaTiO_3$, $SrTiO_3$, $PbZrO_3$, $LiNbO_3$, $Bi_4Ti_3O_{12}$, $Ta_2O_5$, and multi-layered films formed of the aforementioned elements, may be employed other than (Ba, Sr) $TiO_3$. The stacked type capacitor can be modified in various ways within the scope of the gist of the present invention.

According to the semiconductor device and the method of manufacturing the semiconductor device of the present invention, when the dielectric film ((Ba, Sr) $TiO_3$ thin film) for the capacitor or the insulating film covering the conductive film of the depression is formed in the inside of the contact hole by etching the storage node electrode or the conductive film (Ru) formed in the depression in the depth direction of the contact hole with SOG as a mask, a projection is not formed on the underlying storage node electrode. As a result, it is possible to form the dielectric film for the capacitor or the insulating film covering the conductive film of the depression without degradation of breakdown voltage caused by the electric field concentration at the projection.

When the contact hole is formed on the insulating film or the semiconductor substrate serving as an underlying layer of the storage node, if the inner wall of the contact hole is diagonally formed at a taper angle within the range of 90 to 110°, at the same time, if Ru is etched in the depth direction of the contact hole, all step portions are formed in the underlying layer at obtuse angles. It is easy to uniformly form the (Ba, Sr) $TiO_3$ thin film or the insulating film covering the conductive film of the depression on the underlying layer having the obtuse-angled stepped portion by sputtering. When the taper angle is 90°, if Ru is etched in the depth direction of the contact hole, no anomalously grown regions are generated, and the film formed by the CVD method is improved in uniformity.

According to the method of manufacturing the semiconductor device of the present invention, to define the shape of the storage node of the capacitor, it is not necessary to perform direct patterning of the Ru film using an $SiO_2$ mask. Furthermore, since the step of patterning of the Ru film using the third insulating film is added after the second contract hole is formed, followed by removing the third insulating film by wet-etching, the distance between the storage node electrodes can be easily reduced within the resolution limit of lithography, in fewer steps. As a result, the storage capacity increases.

Furthermore, the method of the present invention can be generally applied to a semiconductor device and a method of manufacturing the semiconductor device comprising a laminate structure consisting of the conductive film and the insulating film formed over the depression whose inner wall is diagonally formed with a taper angle within the range of 90° to 110° on the semiconductor substrate or the insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor device comprising:
   an insulating film formed on a semiconductor substrate;
   said insulating film having a depression;
   a first electrode formed in contact with a bottom face and an inner wall of the depression; the conductive film (constituting the first electrode) formed in the upper region of the depression being removed;
   a dielectric film formed so as to cover an upper surface of the insulating film, the insulating film exposed in the upper region of the inner wall of the depression, and the first electrode; and
   a second electrode formed on and in contact with the dielectric film.

2. The semiconductor device according to claim 1, wherein the upper surface of the insulating film having the depression crosses the inner wall of the depression at an interior angle within the range of 90° to 110°.

3. The semiconductor device of claim 1, wherein the depression substantially widens from the bottom face of the depression toward the surface of the semiconductor substrate.

4. The semiconductor device of claim 1, wherein the depression widens from the bottom face of the depression toward the surface of the semiconductor substrate at an angle of about 110 degrees.

5. A semiconductor device comprising:
an insulating film formed on a semiconductor substrate;
said insulating film having a depression, a conductive plug reaching the semiconductor substrate and being exposed in part of the bottom face of the depression;
a first electrode formed in contact with a bottom face and an inner wall of the depression, the conductive film of first electrode formed in an upper region of the inner wall of the depression being removed;
at least one-layer dielectric film formed so as to cover an upper surface of the insulating film, the insulating film exposed in the upper region of the inner wall of the depression, and the first electrode; and
a second electrode formed on and in contact with the dielectric film.

6. The semiconductor device according to claim 5, wherein the upper surface of the insulating film having the depression crosses the inner wall of the depression at an interior angle within the range of 90° to 110°.

7. The semiconductor device of claim 5, wherein the depression substantially widens from the bottom face of the depression toward the surface of the semiconductor substrate.

8. The semiconductor device of claim 5, wherein the depression widens from the bottom face of the depression toward the surface of the semiconductor substrate at an angle of about 110 degrees.

9. The semiconductor device of claim 5, wherein the first electrode is completely contained within the depression.

10. The semiconductor device of claim 5, wherein the conductive plug is disposed completely outside of the depression.

11. A semiconductor device comprising:
a MOS transistor having a source and drain formed on a semiconductor substrate;
an insulating film formed on the MOS transistor;
said insulating film having a depression, a conductive plug reaching either the source or the drain of the MOS transistor being exposed in part of the bottom face of the depression;
a first electrode formed in contact with a bottom face and an inner wall of the depression, the conductive film of the first electrode formed on the upper region of the depression being removed;
at least one-layer dielectric film formed so as to cover an upper surface of the insulating film, the insulating film exposed in the upper region of the inner wall of the depression, and the first electrode; and
a second electrode formed on and in contact with the dielectric film.

12. The semiconductor device according to claim 11, wherein the upper surface of the insulating film having the depression crosses the inner wall of the depression at an interior angle within the range of 90° to 110°.

13. The semiconductor device of claim 11, wherein the depression substantially widens from the bottom face of the depression toward the surface of the semiconductor substrate.

14. The semiconductor device of claim 11, wherein the depression widens from the bottom face of the depression toward the surface of the semiconductor substrate at an angle of about 110 degrees.

15. The semiconductor device of claim 11, wherein the first electrode is completely contained within the depression.

16. The semiconductor device of claim 11, wherein the conductive plug is disposed completely outside of the depression.

17. A semiconductor device comprising:
a semiconductor substrate;
a MOS transistor having a source and drain formed on the semiconductor substrate;
a first insulating film formed on the MOS transistor, said first insulating film having a first contact hole reaching either the source or the drain;
a conductive material filling in the first contact hole;
a second insulating film formed on the first insulating film and the conductive material;
a second contact hole formed in the second insulating film and reaching the conductive material, said first and second insulating films having a depression formed of the second contact hole, said depression having a bottom face formed of an upper surface of the first insulating film and the conductive material exposed in the second contact hole, said depression having an inner wall formed of a sidewall of the second insulating film exposed in the second contact hole;
a storage node electrode formed of a first conductive film covering the bottom face and the inner wall of the depression in a conforming manner, the first conductive film from an upper region of the inner wall of the depression being removed;
a dielectric film laminated over the storage node electrode and covering an upper surface of the second insulating film, the second insulating film exposed in the upper region of the inner wall of the depression, and a surface of the storage node electrode; and
a plate electrode formed of a second conductive film laminated on the dielectric film.

18. The semiconductor device according to claim 17, wherein the dielectric film is formed so as to cover the upper surface of the second insulating film, the upper region of the inner wall of the second insulating film, and the surface of the storage node electrode has a step edge in the interior of the second contact hole and the upper region thereof formed at an interior angle falling within the range of 90 to 110°.

19. The semiconductor device according to claim 17, wherein the storage node electrode is formed of at least one element selected from the group consisting of Ru, Pt, Re, Os, Rh, Ir, oxides thereof, alloys and alloy oxides of the aforementioned elements, W, Nb, Al, Ti, Ta, Mo, Cu, WN, NbN, TiN, TaN, Pd, and the dielectric film is formed of at least one element selected from the group consisting of (Ba, Sr) $TiO_3$, $BaTiO_3$, $SrTiO_3$, $PbZrO_3$, $LiNbO_3$, $Bi_4Ti_3O_{12}$, $Ta_2O_5$, and a multi-layered film formed of the aforementioned elements.

20. The semiconductor device of claim 17, wherein the depression substantially widens from the bottom face of the depression toward the surface of the semiconductor substrate.

21. The semiconductor device of claim 17, wherein the depression widens from the bottom face of the depression toward the surface of the semiconductor substrate at an angle of about 110 degrees.

22. The semiconductor device of claim 17, wherein a depth of the upper region of the inner wall of the depression from which the first conductive film is removed is within a range of about 20 nanometers to about 30 nanometers.

23. The semiconductor device according to claim 17, wherein a depth of the first conductive film constituting part of the storage node electrode removed from the upper region of the inner wall of the depression is within the range of about 20 nanometers to about 30 nanometers.

24. A semiconductor device comprising:
a semiconductor substrate;

an insulating film formed on the semiconductor substrate, the insulating film having a depression, the depression having a bottom face and an inner wall;

a first electrode formed of a first conductive film covering a bottom face and an inner wall of the depression in a conforming manner, the first conductive film from an upper region of the inner wall of the depression being removed;

a dielectric film laminated over the first conducfive film so as to cover an upper surface of the insulating film, the insulating film exposed in the upper region of the inner wall of the depression, and the first electrode; and a second electrode formed of a second conductive film laminated on the dielectric film.

25. A semiconductor device comprising:

a semiconductor substrate;

an insulating film formed on the semiconductor substrate, the insulating film having a depression, the depression having a bottom face and an inner wall;

a conductive plug reaching the semiconductor substrate, the conductive plug being exposed on part of the bottom face of the depression;

a first electrode formed of a first conductive film covering the bottom face and the inner wall of the depression in a conforming manner, the first conductive film from the upper region of the inner wall of the depression being removed;

an at least one-layer dielectric film laminated over the conductive film so as to cover an upper surface of the insulating film, the insulating film exposed in the upper region of the inner wall of the depression, and the first electrode; and a second electrode formed of a second conductive film laminated on the dielectric film.

26. A semiconductor device comprising:

a semiconductor substrate;

a MOS transistor having a source and drain formed on the semiconductor substrate;

an insulating film formed on the MOS transistor, the insulating film having a depression, the depression having a bottom face and an inner wall;

a conductive plug reaching either the source or the drain of the MOS transistor and being exposed on at least a part of the bottom face of the depression;

a first electrode formed of a first conductive film covering the bottom face and the inner wall-of the depression in a conforming manner, the conductive film from an upper region of the inner wall of the depression being removed;

an at least one-layer dielectric film laminated over the first electrode so as to cover an upper surface of the insulating film, the insulating film exposed in the upper region of the inner wall of the depression, and the first electrode; and a second electrode formed of a second conductive film laminated on the dielectric film.

27. A semiconductor device comprising:

a semiconductor substrate;

a MOS transistor having a source and drain formed on the semiconductor substrate;

a first insulating film formed on the MOS transistor, the first insulating film having a contact hole reaching either the source or the drain;

a conductive material disposed within the contact hole;

a second insulating film formed on the first insulating film and having a depression reaching the conductive material, the depression having a bottom face formed of a surface of the first insulating film and of the conductive material, the depression having an inner wall formed of the second insulating film;

a storage node electrode covering the bottom face and the inner wall of the depression except for an upper region of the inner wall of the depression;

a dielectric film formed on the storage node electrode and covering a surface of the second insulating film outside of the depression, the upper region of the inner wall of the depression, and a surface of the storage node electrode; and a plate electrode formed on the dielectric film.

* * * * *